US 6,736,408 B2

(12) United States Patent
Olgado et al.

(10) Patent No.: US 6,736,408 B2
(45) Date of Patent: May 18, 2004

(54) ROTARY VACUUM-CHUCK WITH VENTURI FORMED AT BASE OF ROTATING SHAFT

(75) Inventors: Donald J. K. Olgado, Palo Alto, CA (US); Bernardo Donoso, San Jose, CA (US); Alexander Lerner, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/057,114

(22) Filed: Jan. 25, 2002

(65) Prior Publication Data

US 2003/0141673 A1 Jul. 31, 2003

(51) Int. Cl.⁷ ............................................. B23B 31/00
(52) U.S. Cl. ............................ 279/3; 269/21; 118/500; 118/730
(58) Field of Search .............................. 279/3; 269/21; 118/500, 728, 730; 294/64.2

(56) References Cited

U.S. PATENT DOCUMENTS

| 1,130,679 | A | * | 3/1915 | Staunton | 248/363 |
|---|---|---|---|---|---|
| 2,444,531 | A | * | 7/1948 | Richardson | 451/388 |
| 3,730,134 | A | * | 5/1973 | Kadi | 279/3 |
| 4,184,292 | A | * | 1/1980 | DeFazio et al. | 269/21 |
| 4,416,082 | A | * | 11/1983 | Strobel | 43/102 |
| 4,858,975 | A | * | 8/1989 | Ogawa | 294/64.1 |
| 4,906,011 | A | * | 3/1990 | Hiyamizu et al. | 279/3 |
| 5,113,578 | A | * | 5/1992 | Jackson et al. | 29/743 |
| 5,421,595 | A | * | 6/1995 | Cripe et al. | 279/3 |
| 5,445,052 | A | * | 8/1995 | Nichols, Jr. | 82/152 |
| 5,457,868 | A | * | 10/1995 | Blaimschein | 29/559 |
| 5,921,560 | A | * | 7/1999 | Moshtagh | 279/3 |
| 5,961,169 | A | * | 10/1999 | Kalenian et al. | 294/64.1 |
| 6,022,417 | A | * | 2/2000 | Sumnitsch | 118/728 |
| 6,257,564 | B1 | * | 7/2001 | Avneri et al. | 269/21 |
| 6,397,885 | B1 | * | 6/2002 | Golden et al. | 294/64.2 |
| 6,423,642 | B1 | * | 7/2002 | Peace et al. | 438/694 |
| 6,514,121 | B1 | * | 2/2003 | Halley | 451/5 |

* cited by examiner

Primary Examiner—Daniel W. Howell
(74) Attorney, Agent, or Firm—Dugan & Dugan

(57) ABSTRACT

In a first aspect, a rotary vacuum-chuck is provided that may hold a substrate such as a silicon wafer for rotation. The vacuum-chuck includes a hollow rotary shaft and a chuck mounted on the hollow rotary shaft and having a surface adapted to support a substrate. The chuck has one or more openings in fluid communication with the hollow rotary shaft. A venturi is formed near an end of the hollow rotary shaft to apply vacuum to the hollow rotary shaft and the openings in the chuck surface. No seal is required between the end of the hollow rotary shaft and a surrounding stationary block.

38 Claims, 2 Drawing Sheets

ROTARY VACUUM-CHUCK WITH VENTURI FORMED AT BASE OF ROTATING SHAFT

FIELD OF THE INVENTION

The present invention is concerned with semiconductor device manufacturing equipment, and is more particularly concerned with arrangements for securely holding a substrate while rotating the substrate.

BACKGROUND OF THE INVENTION

Semiconductor device manufacturing generally entails performing a number of processes with respect to a substrate such as a silicon wafer to form integrated circuits on the substrate. For some of the processes, it is necessary or desirable to hold a substrate in a horizontal position while rotating the substrate. For this purpose, it is known to provide a rotary vacuum-chuck which holds the substrate horizontally on a chuck surface while rotating the substrate. In one conventional rotary vacuum-chuck, a chuck surface is mounted on a hollow rotary shaft that is coupled to a vacuum generator. The hollow rotary shaft, in turn, is mounted on a rotary junction or "union" that includes a seal to maintain vacuum within the rotary shaft. A conventional seal may include a rotary disk that rotates with the rotary shaft and a confronting, stationary disk against which the rotary disk rubs.

Problems encountered with conventional seals for rotary vacuum-chucks include a limited useful life due to wear of the seal, and a tendency to generate particles that may contaminate the substrate that is being processed (e.g., as the rotary disk and stationary disk rub together). Further, conventional seals require the rotary shaft to be driven with an additional torque to overcome the frictional forces between the rotary and stationary disks of such seals. Conventional seals also tend to generate heat, and may limit the rotational velocity at which it is practical to rotate a substrate.

Another conventional rotary union known as a "controlled gap" rotary union maintains a small gap (e.g., 5–15 μm over 50–100 mm of engagement) between stationary and rotating parts. A problem with this type of rotary union is the expense of machining the parts, and the tendency for particles to collect in the small, controlled gap. Such particle accumulation may interfere with rotation.

SUMMARY OF THE INVENTION

According to a first aspect of the invention, a rotary vacuum-chuck adapted to hold a substrate for rotation is provided. The vacuum-chuck according to this aspect of the invention includes a hollow rotary shaft having a chuck with a surface adapted to support a substrate. The surface has one or more openings in fluid communication with the hollow rotary shaft. A venturi is positioned adjacent a first end of the hollow rotary shaft, and an inlet is adapted to couple to a source of gas and to direct a flow of gas through the venturi so as to evacuate the hollow rotary shaft and the one or more openings in the surface of the chuck. As used herein a venturi is adjacent an end of a hollow rotary shaft if the venturi is close enough to the end of the hollow rotary shaft to generate a desired vacuum level within the hollow rotary shaft (e.g., a vacuum level that is sufficient to hold a substrate against the chuck as the hollow rotary shaft is rotated at a desired speed).

With the rotary vacuum-chuck of the present invention, seals that employ rubbing parts may be eliminated, so that the generation of potentially contaminating particles may be reduced. Moreover, the maintenance burden that may otherwise occur in connection with periodic replacements of a seal may be avoided; and the rotational speed at which the vacuum-chuck may rotate is not limited by the friction between rubbing portions of a seal. In one aspect, the generation of vacuum at an end of the hollow rotary shaft provides for efficient coupling of vacuum to the rotary shaft and the chuck surface. In a further aspect, the present invention allows for a relatively large gap to exist between the stationary and rotating parts of the rotary vacuum-chuck while still generating a desired vacuum at the chuck surface.

Other features and advantages of the present invention will become more fully apparent from the following detailed description of exemplary embodiments, the appended claims and the accompanying drawing.

DETAILED DESCRIPTION

Figure 1:
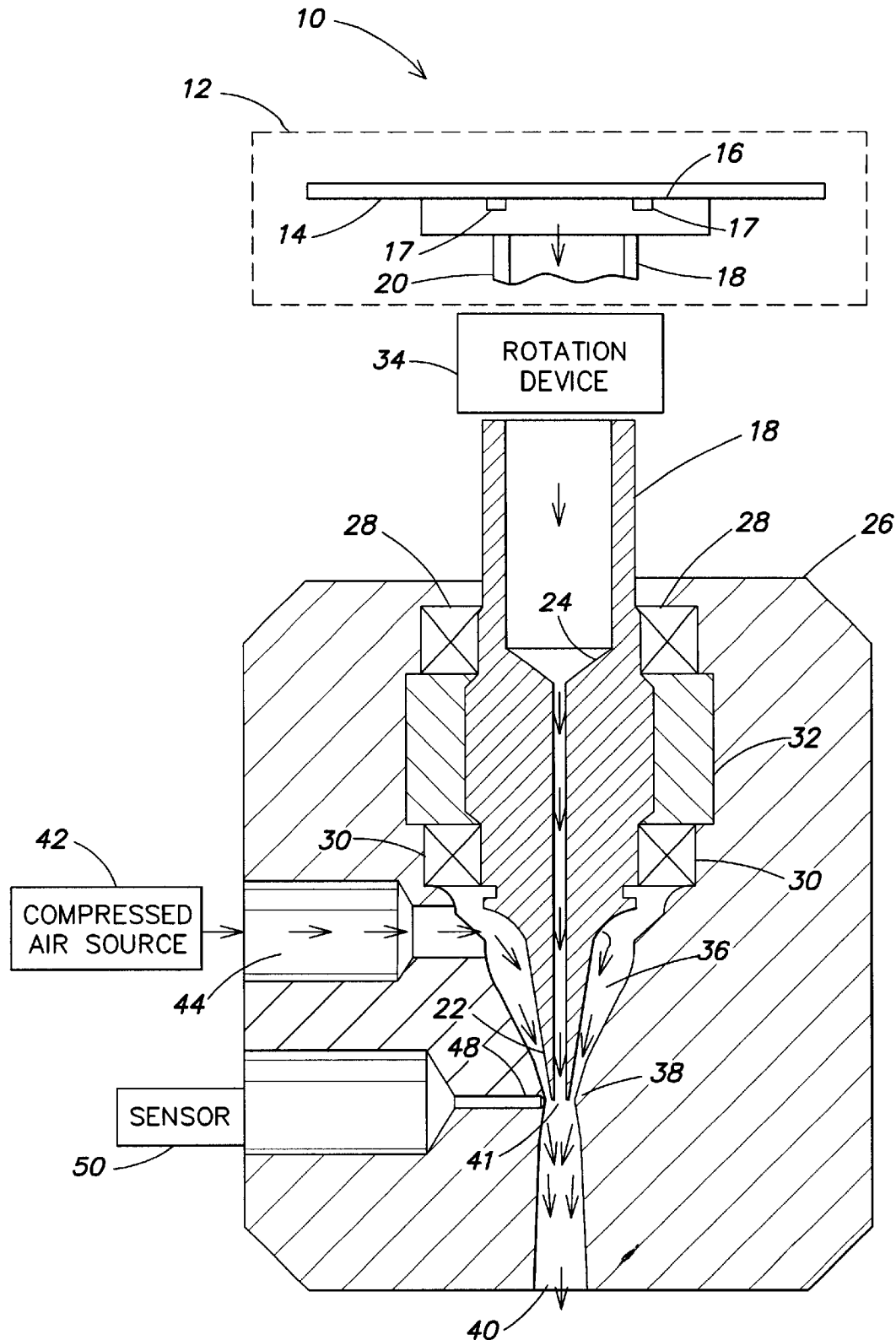
FIG. 1 is a schematic cross-sectional view of a substrate processing chamber, in pertinent part, including a first rotary vacuum-chuck provided in accordance with the invention.

A first embodiment of the invention will now be described with reference to FIG. 1. FIG. 1 is a schematic vertical cross-sectional view of a substrate processing chamber, in pertinent part, including a first rotary vacuum-chuck provided in accordance with the invention. In FIG. 1, reference numeral 10 generally indicates a substrate processing chamber in which the present invention is implemented. Dashed line 12 schematically represents an enclosure of the chamber 10 in which a substrate 14 such as a silicon wafer is secured for processing. The substrate 14 is secured on a conventional chuck surface 16 having openings 17 through which vacuum is applied to the substrate 14. The chuck surface 16 is mounted to (or integrally formed with) a hollow rotary shaft 18. The hollow rotary shaft 18 includes an upper end 20 to which the chuck surface 16 is mounted and a lower end 22 through which vacuum is applied to the hollow rotary shaft 18. An open bore 24 extends through the interior of the hollow rotary shaft 18 between its upper end 20 and lower end 22.

A stationary block 26 surrounds a lower portion of the hollow rotary shaft 18. Bearings 28 and 30 are mounted inside the stationary block 26. A spacer 32, which may be formed of graphite or any other suitable material, separates the bearings 28 and 30. The hollow rotary shaft 18 is mounted for rotation on the bearings 28 and 30. A rotation device (generally represented by reference numeral 34), such as a motor, may be coupled to an intermediate portion of the hollow rotary shaft 18 to impart rotation to the shaft 18, thereby also rotating the chuck surface 16 and the substrate 14 which is secured by vacuum to the chuck surface 16 as described below.

A chamber 36 is formed in the stationary block 26 and surrounds the lower end 22 of the hollow rotary shaft 18. A region 38 of the chamber 36 narrows adjacent the lower end 22 of the hollow rotary shaft 18. Below the narrowing region 38, the chamber 36 widens to form an outlet 40. A venturi 41 thereby is formed with the stationary block 26.

A source 42 of compressed air or other gas is coupled to an upper portion of the chamber 36 via an inlet 44 located above the narrowing region 38. The compressed air source 42 generates a downward flow of air in the chamber 36 and in the venturi 41 past the lower end 22 of the hollow rotary shaft 18 to form a venturi pumping action at the lower end 22 of the hollow rotary shaft 18. The venturi pumping action evacuates the bore 24 of the hollow rotary shaft 18 and the openings 17 of the chuck surface 16. The arrows seen in the inlet 44, the chamber 36 and the bore 24 of the hollow rotary shaft 18 are indicative of directions of air flow in the inlet 44, the chamber 36 and the bore 24. It will be observed that in FIG. 1 the air flow in the chamber 36 is generally in a downward direction (e.g., in the direction in which the rotary hollow shaft 18 extends from its upper end 20 to its lower end 22).

In general, the inventive rotary vacuum-chuck of FIG. 1 need not be configured so that the chuck surface 16 is horizontally oriented, and the use of directional terms such as upper, lower, downward, etc., is for convenience only and is not intended to limit the scope of the invention. Because of the arrangement of the venturi 41 formed near the lower end 22 of the hollow rotary shaft 18, there is no need to provide a seal between the lower end 22 of the hollow rotary shaft 18 and the stationary block 26. By eliminating such a seal, numerous advantages are achieved, including a reduction in particle generation and heat generation, an increase in the practical rotational speed for the hollow rotary shaft 18, and elimination of regular maintenance required to replace seals in conventional rotary junctions.

A sensor port 48 may be provided in the chamber 36, for example, adjacent the lower end 22 of the hollow rotary shaft 18, and extending through the stationary block 26 to a sensor 50 to permit the sensor 50 to sense a degree of vacuum present at the lower end 22 of the hollow rotary shaft 18.

The substrate processing chamber 10 which is schematically illustrated in FIG. 1 may be any type of processing chamber in which a substrate is held in place via a vacuum and is rotated. For example, the processing chamber 10 may be employed for, and include suitable components required for, electroplating, photoresist developing, coating, spin-rinse drying or the like.

Figure 2:
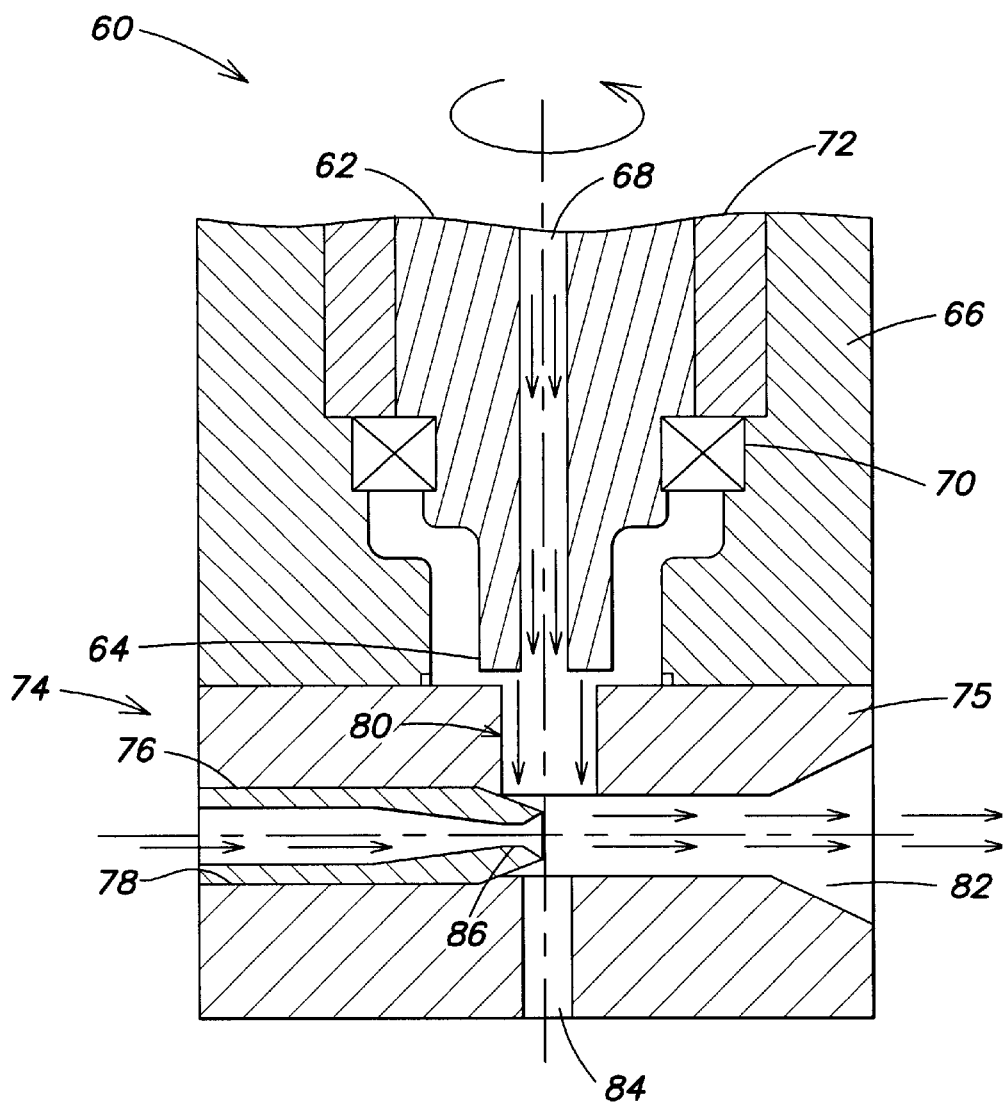
FIG. 2 is a schematic cross-sectional view of a second rotary vacuum-chuck, in pertinent part, in accordance with the invention.

FIG. 2 is a schematic cross-sectional view of a second rotary vacuum-chuck 60, in pertinent part, in accordance with the invention. With reference to FIG. 2, the second rotary vacuum-chuck 60 includes a hollow rotary shaft 62 having a first end (not shown) and a second end 64 that extends into a stationary block 66. The first end (not shown) of the hollow rotary shaft 62 may be similar to the upper end 20 of the hollow rotary shaft 18 of FIG. 1 (e.g., including, for example, the chuck surface 16 for holding a substrate via a vacuum provided through openings 17, a rotation device 34 for rotating the hollow rotary shaft 62, etc.).

The hollow rotary shaft 62 includes an open bore 68 that extends through the interior of the hollow rotary shaft 62 between the first end (not shown) and the second end 64 of the shaft 62. A first set of bearings 70 and a second set of bearings (not shown) are mounted inside the stationary block 66 between the hollow rotary shaft 62 and the stationary block 66 so as to allow the hollow rotary shaft 62 to rotate relative to the stationary block 66. A spacer 72 separates the first and second sets of bearings.

A venturi vacuum system 74 is coupled (e.g., bolted or otherwise fastened) to the stationary block 66 for evacuating the open bore 68 of the hollow rotary shaft 62 as described further below. With reference to FIG. 2, the venturi vacuum system 74 includes an attachable block 75 adapted to couple to the stationary block 66. The attachable block 75 includes (1) a first bore 76 adapted to receive or to form a venturi nozzle 78; (2) an inlet 80 adapted to receive gas evacuated from the open bore 68 of the hollow rotary shaft 62; (3) an outlet 82 adapted to exhaust gas supplied to the venturi nozzle 78 and gas evacuated from the open bore 68 of the hollow rotary shaft 62; and (4) an optional sensor port 84 adapted to permit a sensor (not shown) to measure a degree of vacuum present at the second end 64 of the hollow rotary shaft 62. A source of compressed air or other suitable gas (not shown) may be coupled to the venturi nozzle 78 for supplying compressed air to the venturi nozzle 78 as described further below. The venturi nozzle 78 may comprise any conventional venturi nozzle having a suitably sized tapered constriction 86 as is known in the art.

In operation, a source of compressed air or other suitable gas (not shown) is coupled to the venturi nozzle 78 and delivers compressed gas thereto. As the gas travels through the venturi nozzle 78, a pressure drop is generated at the inlet 80 of the venturi vacuum system 74 and at the second end 64 of the hollow rotary shaft 62. This pressure drop effectively pumps/evacuates the bore 68 of the hollow rotary shaft 62, and the openings (not shown) of the chuck surface (not shown) of the hollow rotary shaft 62 (e.g., via a venturi pumping action). A substrate thereby may be securely held via vacuum to the chuck surface as the hollow rotary shaft 62 is rotated. The arrows in the venturi nozzle 78, the bore 68 of the hollow rotary shaft 62, and the inlet 80 and outlet 82 of the venturi vacuum system 74 are indicative of directions of gas flow during operation of the rotary vacuum-chuck 60.

The rotary vacuum-chuck of FIG. 2 has numerous advantages. For example, because the rotary vacuum-chuck of FIG. 2 may employ a commercially available venturi nozzle, the stationary block 66 is easier to manufacture than the stationary block 26 of the rotary vacuum-chuck of FIG. 1. Further, in the rotary vacuum-chuck of FIG. 2, a venturi does not surround an end of the hollow rotary shaft 62. Accordingly, the hollow rotary shaft 62 of FIG. 2 need not be tapered (e.g., is easier to manufacture than the hollow rotary shaft 18 of FIG. 1), and a larger gap may be maintained between the hollow rotary shaft 62 and the stationary block 66 (e.g., so that particulates or other contaminants are less likely to collect between the hollow rotary shaft 62 and the stationary block 66 and to interfere with rotation of the hollow rotary shaft 62). In at least one embodiment of the invention, the gap between the hollow rotary shaft 62 and the stationary block 66 is about 80–90 microns over an engagement of about 7 mm. This is contrasted with the 5–15 microns over 50–100 mm of engagement for conventional controlled gap rotary unions.

In the rotary vacuum-chuck of FIG. 2, gas flows into the venturi nozzle 78 (and through the outlet 82) in an approximately straight (laminar) flow so that improved venturi action is achieved. The venturi vacuum system 74 also is removable and may be easily replaced without affecting the stationary block 66 and/or the hollow rotary shaft 62, and may be manufactured from a different material than the stationary block 66 if desired.

Both the rotary vacuum-chuck of FIG. 1 and the rotary vacuum-chuck of FIG. 2 exhibit improved vacuum efficiency, as both have a vacuum source (e.g., a venturi) near a hollow rotary shaft (as compared to rotary vacuum-chucks that use remote vacuum sources, such as mechanical pumps, having long piping lengths to evacuate hollow rotary shafts). By placing the source of vacuum (e.g., a venturi) near the point of use (e.g., an end of a hollow rotary shaft), a larger leak rate may be tolerated than if a more remote vacuum source was employed. Accordingly, with use of the present invention, a larger gap between stationary and rotary parts may be employed (e.g., reducing rubbing, wear, heating, etc., of such parts, as well as reducing the affects of particulates/contaminants on rotational freedom of the hollow rotary shaft). For example, in at least one embodiment, a leak rate of around 15–16 l/min may be employed if the capacity of the venturi 41 or the venturi nozzle 78 is about 70 l/min (e.g., larger than the leak rate so as to compensate for the leak rate and maintain the required vacuum). Additionally, combining a venturi with a rotary union reduces the number of parts employed, decreasing rotary vacuum-chuck failures.

The foregoing description discloses only exemplary embodiments of the invention, and modifications of the above disclosed apparatus and methods which fall within the scope of the invention will be readily apparent to those of ordinary skill in the art. For example, the number, shape and size of the openings through which vacuum is applied to a substrate may vary. Similarly, the shape of the hollow rotary shaft and the stationary block may be other than that shown (e.g., the hollow rotary shaft need not be narrowed) so long as together they form a venturi. Also, the rotation device 34 may be coupled in an alternative manner (e.g., closer to the bottom of the shaft) and may comprise pulleys, belts, or other conventional rotation mechanisms.

Although the rotary vacuum-chuck of FIG. 1 is shown as extending through a bottom portion of the enclosure 12 of the chamber 10, in other embodiments the rotary vacuum-chuck may extend through the top or a side wall of the enclosure 12. The rotary vacuum-chuck of FIG. 2 may be similarly configured.

Accordingly, while the present invention has been disclosed in connection with exemplary embodiments thereof, it should be understood that other embodiments may fall within the spirit and scope of the invention as defined by the following claims.

The invention claimed is:

1. A rotary vacuum-chuck adapted to hold a substrate for rotation, comprising:
   a hollow rotary shaft having a chuck with a surface adapted to support a substrate, the surface having one or more openings in fluid communication with the hollow rotary shaft;
   a venturi adjacent a first end of the hollow rotary shaft;
   an inlet adapted to couple to a source of gas and to direct a flow of gas through the venturi so as to evacuate the hollow rotary shaft and the one or more openings in the surface of the chuck;
   a stationary block; and
   a venturi vacuum system detachably coupled to the stationary block;
   wherein the hollow rotary shaft is rotatably coupled to the stationary block, and wherein the venturi forms a portion of the venturi vacuum system.

2. A rotary vacuum-chuck adapted to hold a substrate for rotation, comprising:
   a hollow rotary shaft having a first end and a second end;
   a chuck coupled to the first end of the hollow rotary shaft and having a surface adapted to support a substrate, the surface having one or more openings in fluid communication with the hollow rotary shaft;
   a venturi adjacent the second end of the hollow rotary shaft;
   an inlet adapted to couple to a source of gas and to direct a flow of gas through the venturi, thereby evacuating the hollow rotary shaft and the one or more openings in the surface of the chuck;
   a rotation device coupled to the hollow rotary shaft and adapted to rotate the hollow rotary shaft;
   a stationary block; and
   a venturi vacuum system detachably coupled to the stationary block;
   wherein the hollow rotary shaft is rotatably coupled to the stationary block, and wherein the venturi forms a portion of the venturi vacuum system.

3. The vacuum chuck of claim 2, wherein a gap of greater than 20 microns exists between the hollow rotary shaft and the stationary block.

4. The vacuum chuck of claim 3, wherein the gap is between about 80 and 90 microns.

5. The vacuum chuck of claim 4, wherein the gap exists over an engagement of less than 40 mm.

6. The vacuum-chuck of claim 1, further comprising a sensor port adapted to permit sensing of a degree of vacuum produced by the venturi.

7. The vacuum-chuck of claim 1 wherein the venturi comprises a venturi nozzle positioned so as to flow gas in a straight line past the first end of the hollow rotary shaft.

8. The vacuum chuck of claim 5, wherein the engagement is about 7 mm.

9. A substrate processing chamber, comprising:
   an enclosure; and
   the rotary vacuum-chuck of claim 1 having the chuck surface positioned in the enclosure.

10. The vacuum-chuck of claim 2 wherein the venturi comprises a venturi nozzle positioned so as to flow gas in a laminar flow past the second end of the hollow rotary shaft.

11. The vacuum-chuck of claim 1 wherein the venturi comprises a venturi nozzle positioned so as to flow gas in a laminar flow past the first end of the hollow rotary shaft.

12. The venturi-chuck of claim 2, wherein the capacity of the venturi is less than about 75 l/min., and the venturi is positioned sufficiently close to the second end of the hollow rotary shaft so as to permit employment of a leak rate of greater than 10 l/min.

13. The venturi chuck of claim 12, wherein the capacity of the venturi is about 70 l/min., and the venturi is positioned sufficiently close to the second end of the hollow rotary shaft so as to permit employment of a leak rate of about 15–16 l/min.

14. The vacuum-chuck of claim 2, further comprising a sensor port adjacent the second end of the hollow rotary shaft, the sensor port adapted to permit sensing of a degree of vacuum at the second end of the hollow rotary shaft.

15. The vacuum chuck of claim 2, wherein the venturi vacuum system comprises an attachable block detachably bolted to the stationary block.

16. The vacuum chuck of claim 2 wherein the venturi comprises a venturi nozzle positioned so as to flow gas in a straight line past the second end of the hollow rotary shaft.

17. The vacuum chuck of claim 15, wherein the inlet forms a portion of the attachable block, and the venturi forms a portion of the attachable block.

18. A substrate processing chamber comprising:
   an enclosure; and
   the vacuum-chuck of claim 2 having the chuck surface positioned in the enclosure.

19. A method of holding a substrate for rotation, comprising:

providing a hollow rotary shaft having a first end and a second end, the first end including a chuck having openings in fluid communication with the hollow rotary shaft;

providing a stationary block to which the hollow rotary shaft is rotatably coupled;

providing a venturi vacuum system detachably coupled to the stationary block;

providing a venturi adjacent the second end of the hollow rotary shaft, wherein the venturi forms a portion of the venturi vacuum system; and flowing a gas through the venturi to evacuate the hollow rotary shaft and the openings so as to hold the substrate against the chuck.

20. The method of claim 19, further comprising rotating the hollow rotary shaft.

21. The method of claim 19, further comprising sensing a degree of vacuum at the second end of the hollow rotary shaft.

22. The vacuum chuck of claim 6, wherein the sensor port forms a portion of the venturi vacuum system.

23. The vacuum chuck of claim 1, wherein the venturi vacuum system comprises an attachable block detachably bolted to the stationary block.

24. The vacuum chuck of claim 23, wherein the inlet forms a portion of the attachable block, and the venturi forms a portion of the attachable block.

25. The vacuum chuck of claim 24, further comprising an outlet adapted to exhaust gas supplied to the venturi and gas evacuated from the hollow rotary shaft.

26. The vacuum chuck of claim 25, wherein the attachable block further comprises an additional inlet adapted to receive gas evacuated from the hollow rotary shaft, and wherein the outlet forms a portion of the attachable block.

27. The vacuum chuck of claim 6, wherein the venturi vacuum system comprises an attachable block detachably bolted to the stationary block, and wherein the sensor port forms a portion of the attachable block.

28. The vacuum chuck of claim 1, wherein a gap of greater than 20 microns exists between the hollow rotary shaft and the stationary block.

29. The vacuum chuck of claim 28, wherein the gap is between about 80 and 90 microns.

30. The vacuum chuck of claim 29, wherein the gap exists over an engagement of less than 40 mm.

31. The vacuum chuck of claim 30, wherein the engagement is about 7 mm.

32. The method of claim 19, wherein flowing a gas through the venturi to evacuate the hollow rotary shaft and the openings so as to hold the substrate against the chuck comprises flowing a laminar flow of gas past the second end of the hollow rotary shaft.

33. The venturi-chuck of claim 1, wherein the capacity of the venturi is less than about 75 l/min., and the venturi is positioned sufficiently close to the first end of the hollow rotary shaft so as to permit employment of a leak rate of greater than 10 l/min.

34. The venturi chuck of claim 33, wherein the capacity of the venturi is about 70 l/min., and the venturi is positioned sufficiently close to the first end of the hollow rotary shaft so as to permit employment of a leak rate of about 15–16 l/min.

35. The vacuum chuck of claim 14, wherein the sensor port forms a portion of the venturi vacuum system.

36. The vacuum chuck of claim 17, further comprising an outlet adapted to exhaust gas supplied to the venturi and gas evacuated from the hollow rotary shaft.

37. The vacuum chuck of claim 36, wherein the attachable block further comprises an additional inlet adapted to receive gas evacuated from the hollow rotary shaft, and wherein the outlet forms a portion of the attachable block.

38. The vacuum chuck of claim 14, wherein the venturi vacuum system comprises an attachable block detachably bolted to the stationary block, and wherein the sensor port forms a portion of the attachable block.

* * * * *